(12) United States Patent
Madurawe et al.

(10) Patent No.: US 6,295,230 B1
(45) Date of Patent: Sep. 25, 2001

244333

(54) NONVOLATILE CONFIGURATION CELLS AND CELL ARRAYS

(75) Inventors: Raminda U. Madurawe, Sunnyvale; James D. Sansbury, Portola Valley, both of CA (US)

(73) Assignee: Altera Coporation, San Jose, CA (US)

( * ) Notice: Subject to any disclaimer, the term of this patent is extended or adjusted under 35 U.S.C. 154(b) by 0 days.

(21) Appl. No.: 09/385,743

(22) Filed: Aug. 30, 1999

Related U.S. Application Data

(62) Division of application No. 09/170,993, filed on Oct. 13, 1998, now Pat. No. 6,226,201, which is a continuation of application No. 08/710,398, filed on Sep. 16, 1996, now Pat. No. 6,005,806.
(60) Provisional application No. 60/013,435, filed on Mar. 14, 1996.

(51) Int. Cl.[7] .................................................. G11C 16/04
(52) U.S. Cl. .................................. 365/185.28; 365/185.1
(58) Field of Search .................... 365/185.28, 185.18, 365/185.1

(56) References Cited

U.S. PATENT DOCUMENTS

| | | | |
|---|---|---|---|
| 4,546,454 | 10/1985 | Gupta et al. | 365/200 |
| 4,609,986 | 9/1986 | Hartmann et al. | 364/200 |
| 4,617,479 | 10/1986 | Hartmann et al. | 307/465 |
| 4,628,487 | 12/1986 | Smayling | 365/185 |
| 4,677,318 | 6/1987 | Veenstra et al. | 307/465 |
| 4,713,792 | 12/1987 | Hartmann et al. | 364/900 |
| 4,785,423 | 11/1988 | Skupnjak et al. | 365/189 |
| 4,788,663 | * 11/1988 | Tanaka | 365/185 |
| 4,871,930 | 10/1989 | Wong et al. | 307/465 |
| 4,885,719 | 12/1989 | Brahmbhatt | 365/181 |
| 4,899,067 | 2/1990 | So et al. | 307/465 |
| 4,899,070 | 2/1990 | Ou et al. | 307/530 |
| 4,912,342 | 3/1990 | Wong et al. | 307/465 |
| 4,930,097 | 5/1990 | Ledenbach et al. | 364/716 |
| 4,935,648 | 6/1990 | Radjy et al. | 307/468 |
| 4,979,146 | 12/1990 | Yokoyama et al. | 365/185 |
| 5,005,155 | 4/1991 | Radjy et al. | 365/185 |
| 5,016,217 | 5/1991 | Brahmbhatt | 365/185 |
| 5,021,693 | 6/1991 | Shima | 307/494 |
| 5,028,821 | 7/1991 | Kaplinsky | 307/465 |
| 5,043,941 | 8/1991 | Sakamoto | 365/185 |
| 5,053,996 | 10/1991 | Slemmer | 365/156 |
| 5,097,449 | 3/1992 | Cuevas | 365/228 |
| 5,121,006 | 6/1992 | Pedersen et al. | 307/465 |
| 5,138,576 | 8/1992 | Madurawe | 365/125 |
| 5,153,880 | 10/1992 | Owen et al. | 371/10.2 |
| 5,161,157 | 11/1992 | Owen et al. | 371/10.2 |
| 5,162,680 | 11/1992 | Norman et al. | 307/530 |
| 5,170,373 | 12/1992 | Doyle et al. | 365/185 |
| 5,200,652 | 4/1993 | Lee | 307/465 |
| 5,220,533 | 6/1993 | Turner | 365/218 |
| 5,241,224 | 8/1993 | Pedersen et al. | 307/465 |
| 5,247,478 | 9/1993 | Gupta et al. | 365/185 |
| 5,251,169 | 10/1993 | Josephson | 365/72 |
| 5,260,610 | 11/1993 | Pedersen et al. | 307/465 |
| 5,260,611 | 11/1993 | Cliff et al. | 307/465 |

(List continued on next page.)

*Primary Examiner*—A. Zarabian
(74) *Attorney, Agent, or Firm*—Townsend and Townsend and Crew LLP

(57) ABSTRACT

A memory cell (400) used to store data in an integrated circuit. The memory cell (400) is static, nonvolatile, and programmable. The layout of the memory cell is compact. A logic high output from the memory cell (400) is about VDD and a logic low output is about VSS. The memory cell (400) of the present invention includes a programmable memory element (515). In one embodiment, the programmable memory element (515) is coupled between supply voltage (510) and an output node (405). A pull-down device (525) is coupled between another supply voltage (505) and the output node (405). The memory cell (400) may be used to store the configuration information for a programmable logic device (121).

29 Claims, 12 Drawing Sheets

U.S. PATENT DOCUMENTS

| | | | |
|---|---|---|---|
| 5,272,368 | 12/1993 | Turner et al. | 257/315 |
| 5,329,487 | 7/1994 | Gupta et al. | 365/185 |
| 5,339,271 | 8/1994 | Tanagawa | 365/185.24 |
| 5,350,954 | 9/1994 | Patel et al. | 307/465 |
| 5,353,248 | 10/1994 | Gupta | 365/154 |
| 5,438,295 | 8/1995 | Reddy et al. | 327/408 |
| 5,440,246 | 8/1995 | Murray et al. | 365/96 |
| 5,457,653 | 10/1995 | Lipp | 365/185.18 |
| 5,488,586 | 1/1996 | Madurawe et al. | 365/218 |
| B1 4,617,479 | 9/1993 | Hartmann et al. | 307/465 |

\* cited by examiner

─┼─ = ─┼─► (i.e., Crossover without Connection or Possibility of Connection)

─┼─ = ─┼─ or ─┼─ (i.e., Can Only be Connected or Disconnected, As Input or Output, But Cannot be Broken)

■ = Full Interchange

✳ = Full Interchange

─┼─ = Partial Interchange: ─┴─ ─┴─ ─┴─ ─┴─

Lines (4 Vertical Shown) that do not have ■ or ✳ Intersections are Intended to be Low Skew (i.e., Clock or Other) Paths.

▩ = Bidirectional Amplifier (Direction is Selectable) to Prevent Signal Drooping Through too Many Pass Devices.

*FIG. 2E*

NONVOLATILE CONFIGURATION CELLS AND CELL ARRAYS

This application is a division of U.S. patent application Ser. No. 09/170,993, filed Oct. 13, 1998, now U.S. Pat. No. 6,226,201 which is a continuation of U.S. patent application Ser. No. 08/710,398, filed Sep. 16, 1996 U.S. Pat. No. 6,005,806, which claims the benefit of U.S. provisional application No. 60/013,435, filed Mar. 14, 1996, all of which are incorporated by reference.

BACKGROUND OF THE INVENTION

The present invention relates to the field of integrated circuit memory technology. More specifically, the present invention provides a static nonvolatile memory cell for storing data.

Memory cells are used in the implementation of many types of electronic devices and integrated circuits. These devices include microprocessors, static random access memories (SRAMs), erasable-programmable read only memories (EPROMs), electrically erasable programmable read only memories (EEPROMs), Flash EEPROM memories, programmable logic devices (PLDs), field programmable gate arrays (FPGAs), application specific integrated circuits (ASICs), among others. Memory cells are used to store the data and other information for these and other integrated circuits.

As integrated circuit technology and semiconductor processing continue to advance, there is a need for greater densities and functionality in integrated circuits, which are often determined in a large part by the size of the memory cells. Further, it is desirable that the memory cells have improved operating characteristics, such as lower power consumption, nonvolatility, greater device longevity, improved data retention, better transient performance, superior voltage and current attributes, and improvements in other similar attributes.

Furthermore, improved memory cells are especially needed for particular applications, such as PLD integrated circuits. PLDs are well known to those in the electronic art. Such programmable logic devices are commonly referred as PALs (Programmable Array Logic), PLAs (Programmable Logic Arrays), FPLAs, PLDs, EPLDs (Erasable Programmable Logic Devices), EEPLDs (Electrically Erasable Programmable Logic Devices), LCAs (Logic Cell Arrays), FGPAs (Field Programmable Gate Arrays), and the like. Such devices are used in a wide array of applications where it is desirable to program standard, off-the-shelf devices for a specific application. Such devices include, for example, the well-known, Classic™, and MAX® 5000, MAX® 7000, and FLEX® 8000 EPLDs made by Altera Corp.

PLDs are generally known in which many logic array blocks (LABs) are provided in a two-dimensional array. LABs contain a number of individual programmable logic elements (LEs) which provide relatively elementary logic functions such as NAND, NOR, and exclusive OR. Further, PLDs have an array of intersecting signal conductors for programmably selecting and conducting logic signals to, from, and between the LABs and LEs. The configuration of the LABs, LEs, and interconnections between these logical elements is stored in memory cells. Memory cells may be used to programmably control the composition, configuration, and arrangements of logic array blocks (LABs) and logic elements (LEs) and also the interconnections between these logic array blocks and logic elements.

Resulting from the continued scaling and shrinking of semiconductor device geometries which are used to form integrated circuits (also known as "chips"), integrated circuits have progressively become smaller and denser. For programmable logic, it becomes possible to put greater numbers of programmable logic elements onto one integrated circuit. Furthermore, as the number of elements increases, it becomes increasingly important to improve the techniques and architectures used for interconnecting the elements and routing signals between the logic blocks. Also as PLDs increase in size and complexity, greater numbers of memory cells are required on to hold the configuration information of the logical elements.

While such devices have met with substantial success, such devices also meet with certain limitations, especially in situations in which the provision of more complex logic modules and additional or alternative types of interconnections between the logic modules would have benefits sufficient to justify the additional circuitry and programming complexity. There is also a continuing demand for logic devices with larger capacity. This produces a need to implement logic functions more efficiently and to make better use of the portion of the device which is devoted to interconnecting individual logic modules. Moreover, there is a need to more efficiently and effectively store the configuration information of PLDs. The memory technology used to store the configuration information of the PLD should be compact, power efficient, programmable and nonvolatile, require little additional programming circuitry overhead, and generally provide enhancements to the performance and features of PLD logic modules and interconnections.

As can be seen, an improved memory cell is needed, especially an improved memory cell for storing the configuration information or the logic elements and interconnections of a programmable logic device.

SUMMARY OF THE INVENTION

The present invention provides a static, nonvolatile, and programmable memory cell for storing data in an integrated circuit. The memory cell of the present invention includes a programmable memory element. The programmable memory element is coupled between a voltage source, such as VDD or VSS, and an output node. The programmable memory element may be fabricated using many different memory technologies, including antifuse, EPROM, EEPROM, and Flash EEPROM, to name a few. In one embodiment, the programmable memory element is coupled between VDD and the output node. A pull-down device is coupled between VSS and the output node. In another embodiment, the programmable memory element is coupled between VSS and the output node. A pull-up device is coupled between VDD and the output node. The pull-down or pull-up device may be a resistor, among other devices, which may be formed using diffusion polysilicide, polysilicon, thin-film transistor, or other structure or material.

Operation of the invention when the programmable memory element is coupled between VDD and the output node is as follows. When the programmable memory element is erased, the memory cell stores and outputs a logic high at the output node. When the programmable memory element is programmed, the memory cell stores and outputs a logic low at the output node. A logic high output from the memory cell is about VDD and a logic low output is about VSS. More specifically, when the programmable memory element is programmed, a first pull-down current, or standby pull-down current, to VSS through the pull-down device will pull the output node to about VSS. Except for leakage currents, the first pull-down current may be about zero microamps. In this state, the memory cell consumes no static power.

When the programmable memory element is erased, the output node will be coupled through the programmable memory element to VDD. A second pull-down current to VSS through the pull-down device will be drained through the programmable memory element to VSS. The output node will be about VDD. The second pull-down current may be much less than one microamp. Operation of the invention when the programmable memory element is coupled between the output node and VSS would be analogous to this discussion.

In an embodiment of the present invention, the resistance of the pull-down device is substantially less than the off resistance of the programmable memory element when the programmable memory element is programmed. The resistance of the pull-down device is substantially more than the on resistance of the programmable memory element when the programmable memory element is erased.

The memory cell of the present invention is extremely compact. The layout of the memory cell is compact. The memory cell has extremely low power consumption. A plurality of memory cells of the present invention has relatively low power consumption. The memory cell may be used to store the configuration information for a programmable logic device.

More specifically, the memory cell of the present invention includes: an output node, for providing approximately full-rail output voltages; and a pull-down device, coupled between a first voltage source at a first voltage level and the output node. The pull-down device provides a first pull-down current when the memory cell stores a logic low and a second pull-down current when the memory cell stores a logic high. The memory cell further includes a nonvolatile programmable memory element, which is coupled between the output node and a second voltage source at a second voltage level. The second voltage level is above the first voltage level. Further, the nonvolatile programmable memory element stores data and retains this data, even when power is removed from the integrated circuit. The first pull-down current pulls the output node to about the first voltage level when the nonvolatile programmable memory element is programmed. And, the second pull-down current is drained through the nonvolatile programmable memory element from the second voltage source so that the output node is about the second voltage level when the nonvolatile programmable memory element is erased.

In a further embodiment, the present invention is a programmable logic device including: a first plurality of conductors extending in a first direction for conducting logic signals; and a second plurality of conductors in a second direction, transverse to said first direction, for conducting logic signals; and a plurality of programmable intersections for programmably coupling the first plurality of conductors to the second plurality of conductors. A programmable intersection includes: an output node for providing approximately full-rail output voltages; a pull-down resistor, coupled between a first voltage source at a first voltage level and the output node; and a nonvolatile memory element, coupled between the output node and a second voltage source at a second voltage level, where this second voltage level is above the first voltage level. Further, the nonvolatile memory element stores data and retains this data, even when power is removed from the programmable logic device.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 2E shows a description of the meanings of the symbols used in FIG. 2D;

DETAILED DESCRIPTION OF THE PREFERRED EMBODIMENTS

Figure 1:
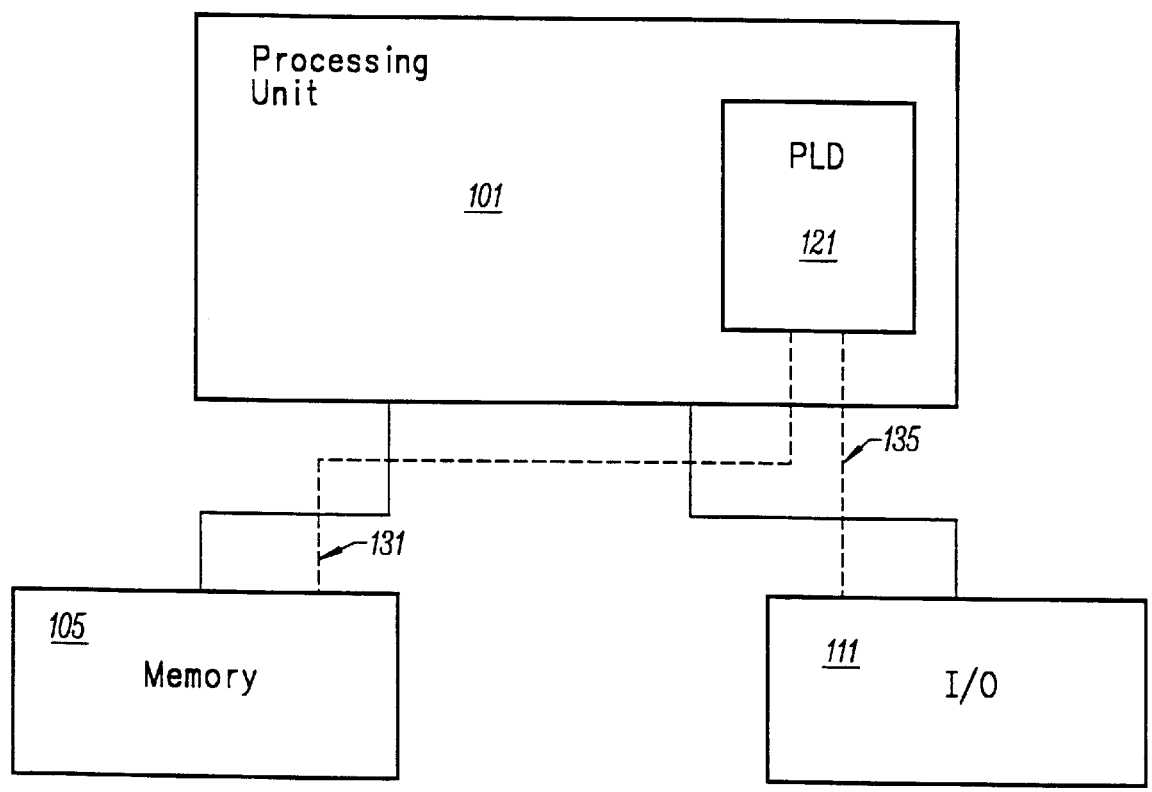
FIG. 1 is a block diagram of a digital system incorporating a programmable logic device integrated circuit.

FIG. 1 shows a block diagram of a digital system within which the present invention may be embodied. In the particular embodiment of FIG. 1, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, the system may be a general purpose computer, a special purpose computer (such as telecommunications equipment) optimized for an application-specific task such as programming PLD 121, or a combination of a general purpose computer and auxiliary special purpose hardware.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system.

In some embodiments, processing unit 101 may even be a computer system. In one embodiment, source code may be stored in memory 105, compiled into machine language, and executed by processing unit 101. Processing unit 101 need not contain a CPU and in one embodiment, instructions may be executed by one or more PLDs 121. Instead of storing source code in memory 105, only the machine language representation of the source code, without the source code, may be stored in memory 105 for execution by processing unit 101. Memory 105 may be a random access memory (RAM), read only memory (ROM), fixed or flexible disk media, PC Card flash disk memory, tape, or any other storage retrieval means, or any combination of these storage retrieval means.

Processing unit 101 uses I/O 111 to provide an input and output path for user interaction. For example, a user may input logical functions to be programmed into programmable logic device 121. I/O 111 may be a keyboard, mouse, track ball, digitizing tablet, text or graphical display, touch screen, pen tablet, printer, or other input or output means, or any combination of these means. In one embodiment, I/O 111 includes a printer used for printing a hard copy of any processing unit 101 output. In particular, using I/O 111, a user may print a copy of a document prepared using a word processing program executed using processing unit 101. In other cases, a user may print out a copy of the source code or a listing of the logical functions contained within PLD 121.

PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2A:
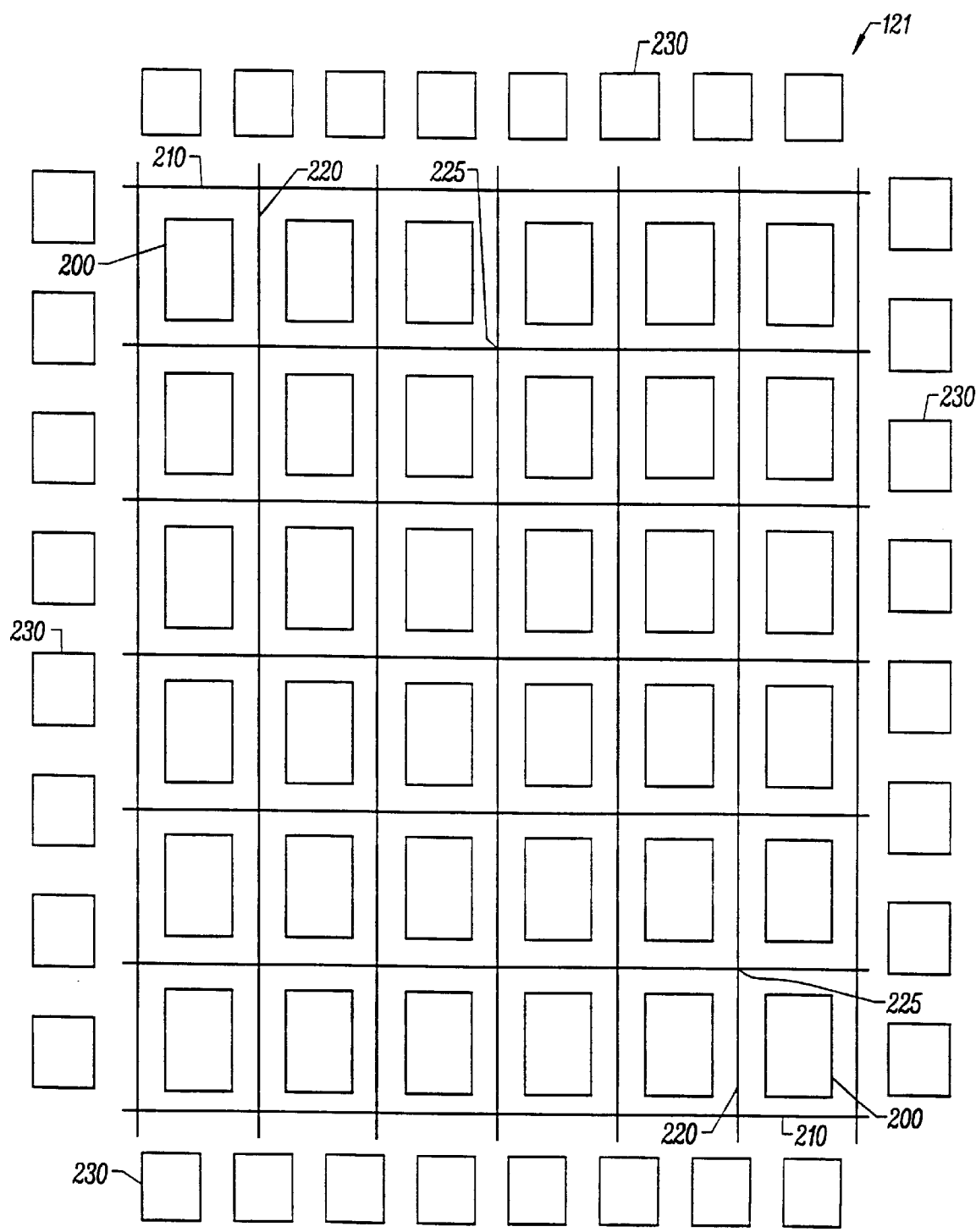
FIG. 2A is a block diagram showing an architecture for a programmable logic device.
Figure 2B:
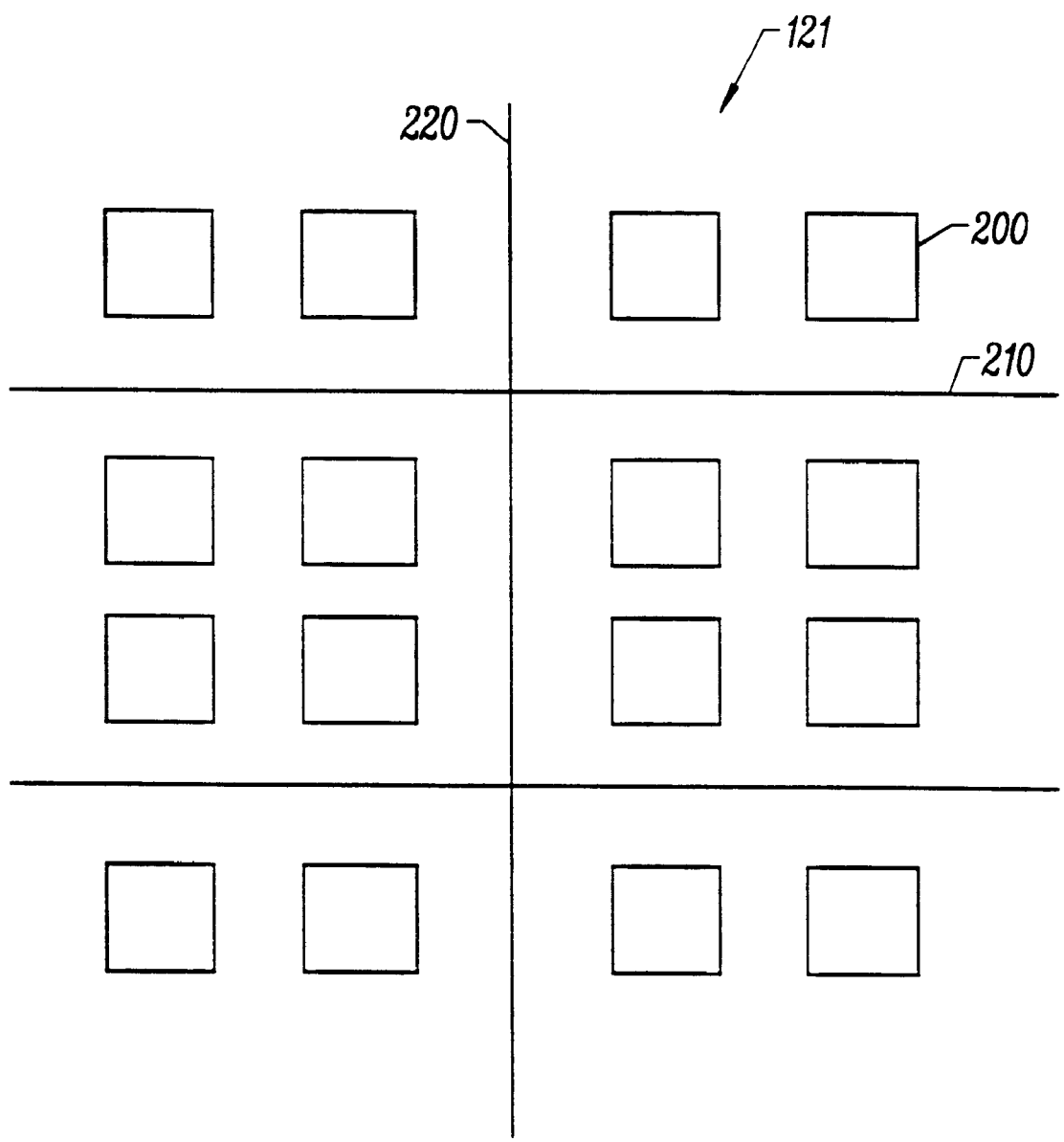
FIG. 2B is a block diagram showing an architecture for a programmable logic device.
Figure 2C:
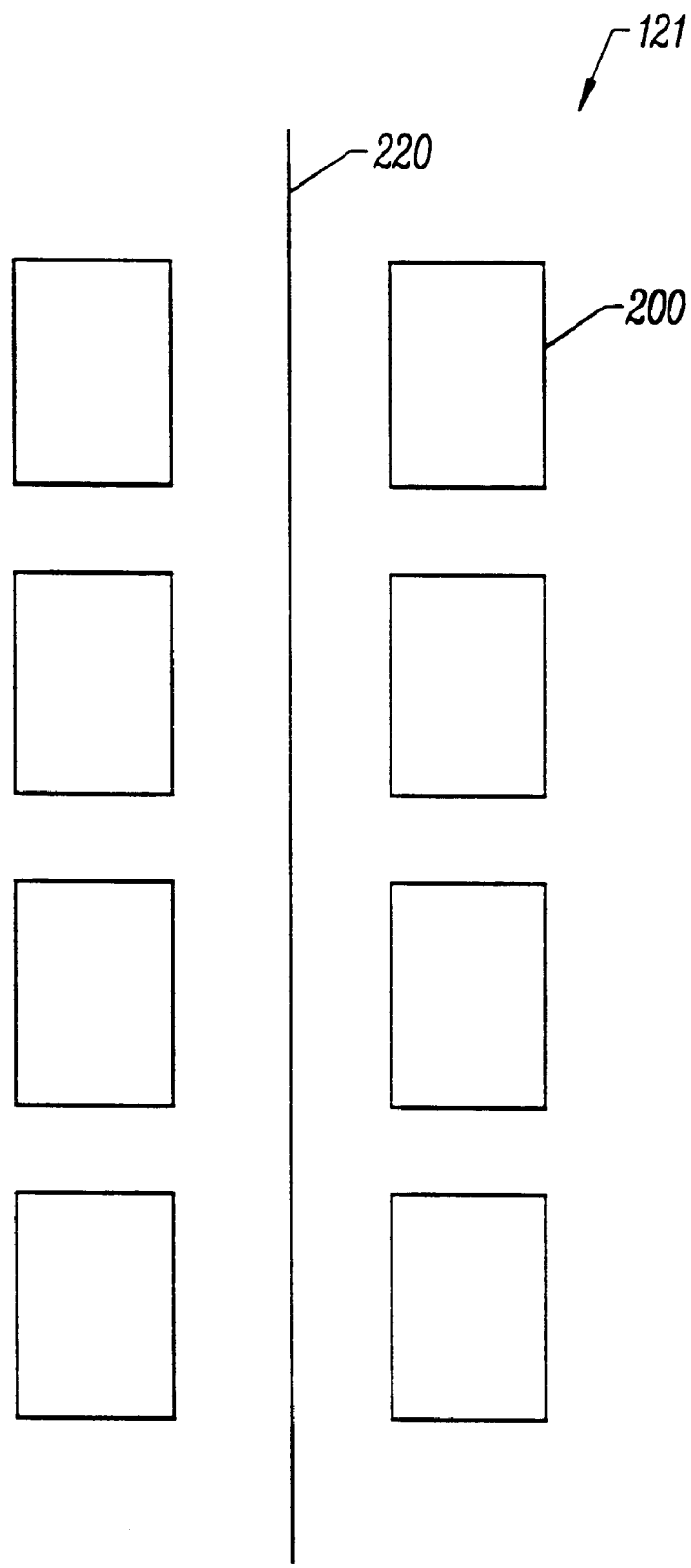
FIG. 2C is a block diagram showing an architecture for a programmable logic device.
Figure 2D:
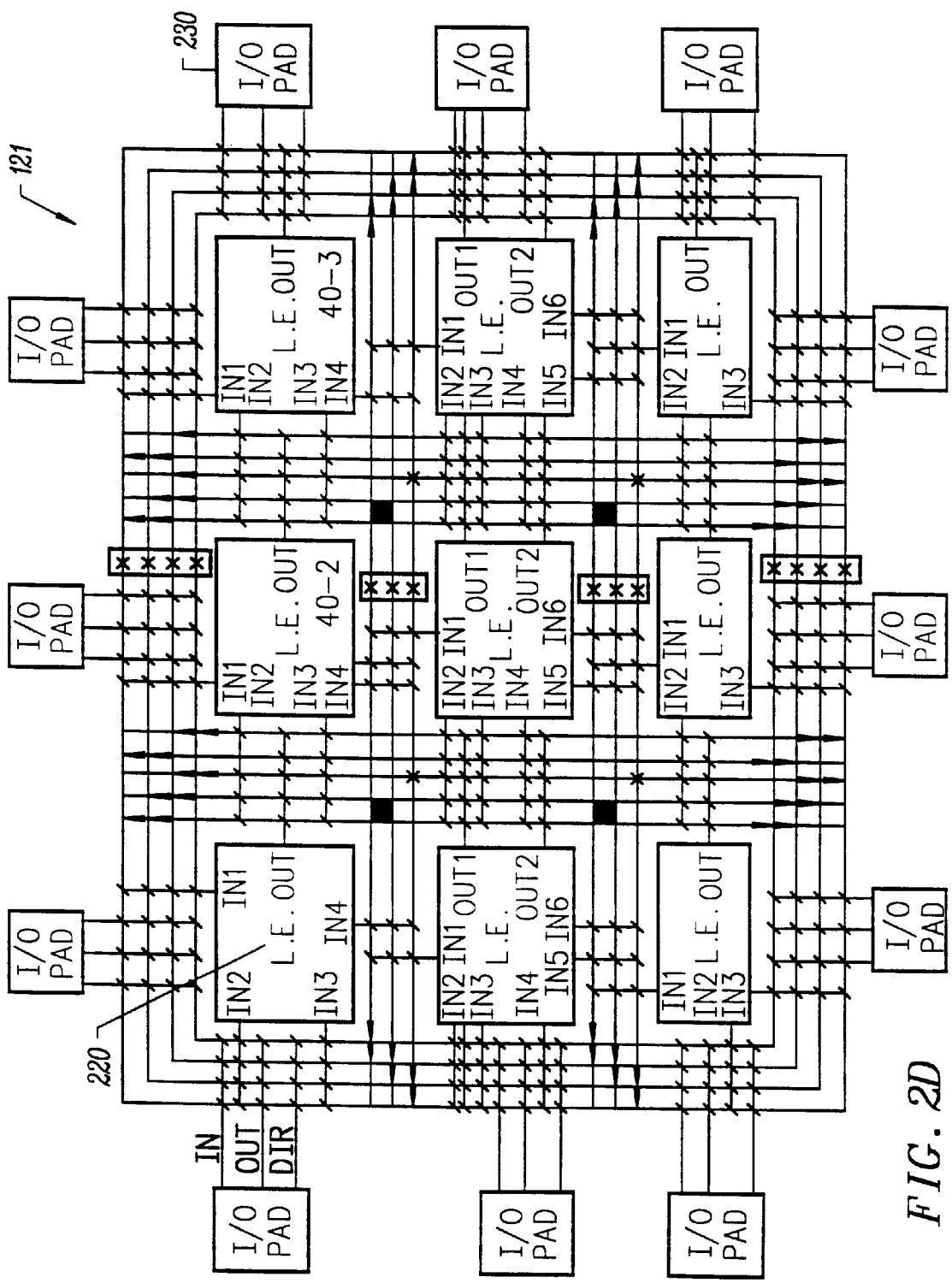
FIG. 2D is a block diagram showing a segmented programmable interconnect architecture for a programmable logic device.

FIG. 2A is a simplified block diagram of an overall internal architecture and organization of PLD 121 of FIG. 1. Other architectures are shown in FIGS. 2B–D. Many details of PLD architecture, organization, and circuit design are not necessary for an understanding of the present invention and such details are not shown in FIGS. 2A–D.

FIG. 2A shows a six-by-six two-dimensional array of thirty-six logic arrays blocks (LABs) 200. LAB 200 is a physically grouped set of logical resources that is configured or programmed to perform logical functions. The internal architecture of a LAB will be described in more detail below in connection with FIG. 3. PLDs may contain any arbitrary number of LABs, more or less than the PLD 121 shown in FIG. 2A. Generally, in the future, as technology advances and improves, programmable logic devices with even greater numbers of logic array block will undoubtedly be created. Furthermore, LABs 200 need not be organized in a square matrix; for example, the array may be organized in a five-by-seven or a twenty-by-seventy matrix of LABs.

LAB 200 has inputs and outputs (not shown) which may or may not be programmably connected to a global interconnect structure, comprising an array of global horizontal interconnects (GHs) 210 and global vertical interconnects (GVs) 220. Although shown as single lines in FIG. 2A, each GH 210 and GV 220 line may represent a plurality of signal conductors. The inputs and outputs of LAB 200 are programmably connectable to an adjacent GH 210 and an adjacent GV 220. Utilizing GH 210 and GV 220 interconnects, multiple LABs 220 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location on PLD 121 to another LAB 200 at another location on PLD 121. Furthermore, an output signal from one LAB 200 can be directed into the inputs of one or more LABs 200. Also, using the global interconnect, signals from a LAB 200 can be fed back into the same LAB 200. In other embodiments or the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

The PLD architecture in FIG. 2A further shows at the peripheries of the chip, input-output drivers 230. Input-output drivers 230 are for interfacing the PLD to external, off-chip circuitry. FIG. 2A shows thirty-two input-output drivers 230; however, a PLD may contain any number of input-output drivers, more or less than the number depicted. Each input-output driver 230 is configurable for use as an input driver, output driver, or bidirectional driver.

FIG. 2B shows a simplified block diagram of an alternative PD architecture. In this embodiment, a plurality of LABs 200 may be programmably coupled using GHs 210 and GV 220. This architecture may also have input-output drivers 230, but are not shown in order to simplify the diagram. The input-output driver functions may also be incorporated within LABs 200, or some LABs 200. The memory cell of the present invention may be used to store the configuration of the components of this PLD architecture.

FIG. 2C shows a simplified block diagram of another PLD architecture. In this embodiment, a plurality of LABs 200 may be programmably coupled using GV 220. This architecture may also have input-output drivers 230, but are not shown in order to simplify the diagram. The memory cell of the present invention may be used to store the configuration of the components of this PLD architecture.

FIG. 2D shows a block diagram of another PLD architecture. In this embodiment, a plurality of LABs 200 may be programmably coupled using a "segmented" programmable interconnect. FIG. 2E shows a description of the meanings of the interconnect symbols used in FIG. 2D. A plurality of input-output drivers 230 surround the LABs 200. The architecture in FIG. 2D has segmented programmable interconnect, where signals and LABs 200 are coupled using programmable interconnect segments, which do not necessarily run the entire length of a row or column of LABs 200. The memory cell of the present invention may be used to store the configuration of the components of this PLD architecture.

Figure 3:
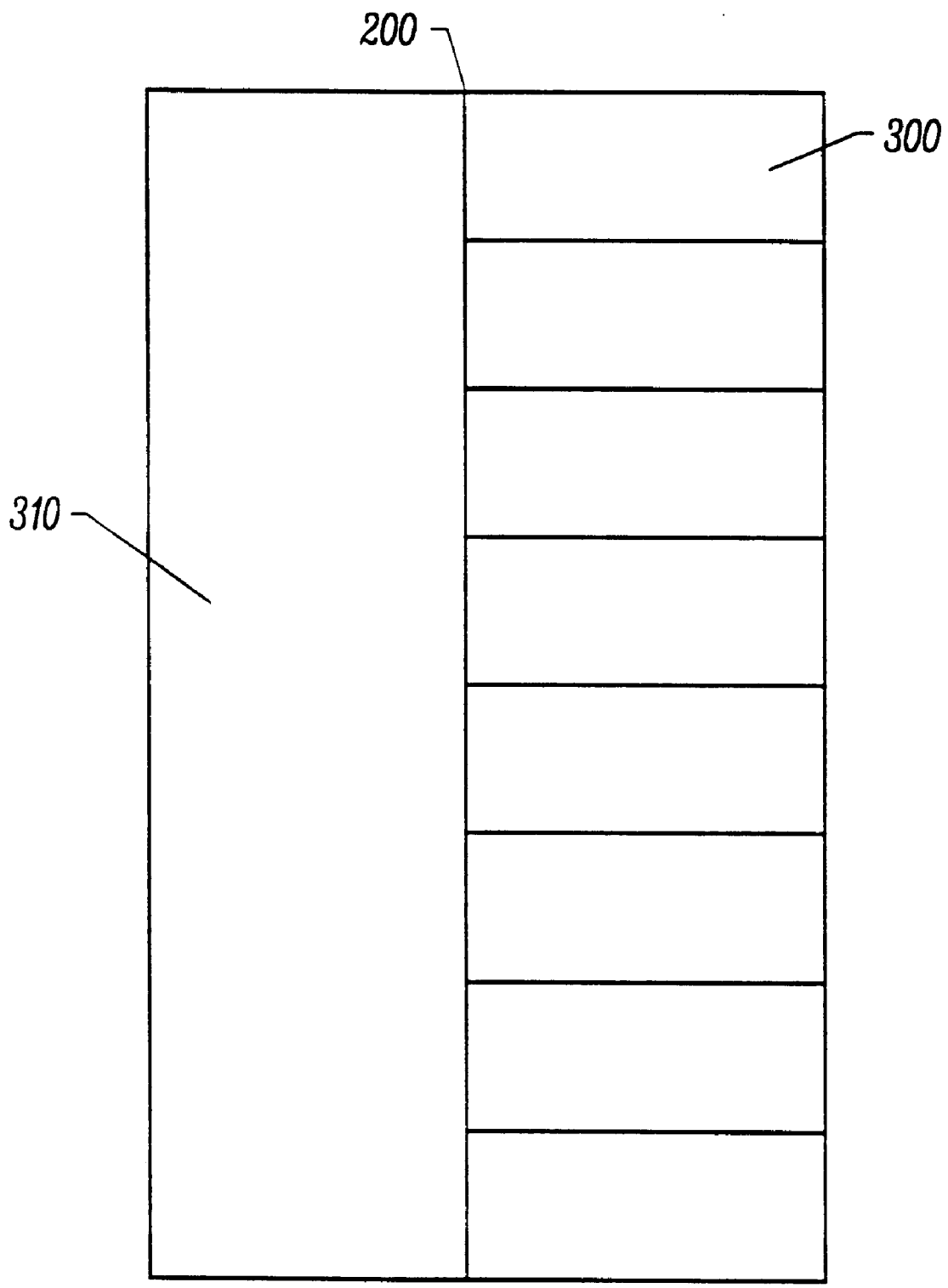
FIG. 3 is a simplified block diagram of a logic array block (LAB) of a programmable logic device.

FIG. 3 shows a simplified block diagram of LAB 200 of FIGS. 2A–D. LAB 200 is comprised of a varying number of logic elements (LEs) 300, sometimes referred to as "logic cells," and a local (or internal; interconnect structure 310. LAB 200 has eight LEs 300, but LAB 200 may have any number of LEs, more or less than eight. In a further embodiment of the present invention, LAB 200 has two "banks" of eight LEs for a total of sixteen LEs, where each bank has separate inputs, outputs, control signals, and carry chains.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310, although LE 300 may be implemented in many architectures other than those shown in FIGS. 1–3. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220. Through local interconnect structure 310 and local feedback, LEs 300 are programmably connectable to form larger, more complex logical functions than can be realized using a single LE 300. Furthermore, because of its reduced size and shorter length, local interconnect structure 310 has reduced parasitics compared to the global interconnection structure. Consequently, local interconnect structure 310 generally allows signals to propagate faster than through the global interconnect structure.

The memory cell of the present invention may be used in various places in a PLD. For example, the memory cell may be used to implement and store the configuration of a look-up table, function generator, programmable interconnect, and other components of the PLD. Using the memory cell of the present invention, a RAM may be constructed that will be used to implement the look-up tables used in LEs 300. The memory cell of the present invention may also be as a storage bit. This storage bit may be used, for example, to determine whether an LE is in registered or sequential mode. The storage bit may also be used to configure the operation of a programmable multiplexer.

Figure 4:
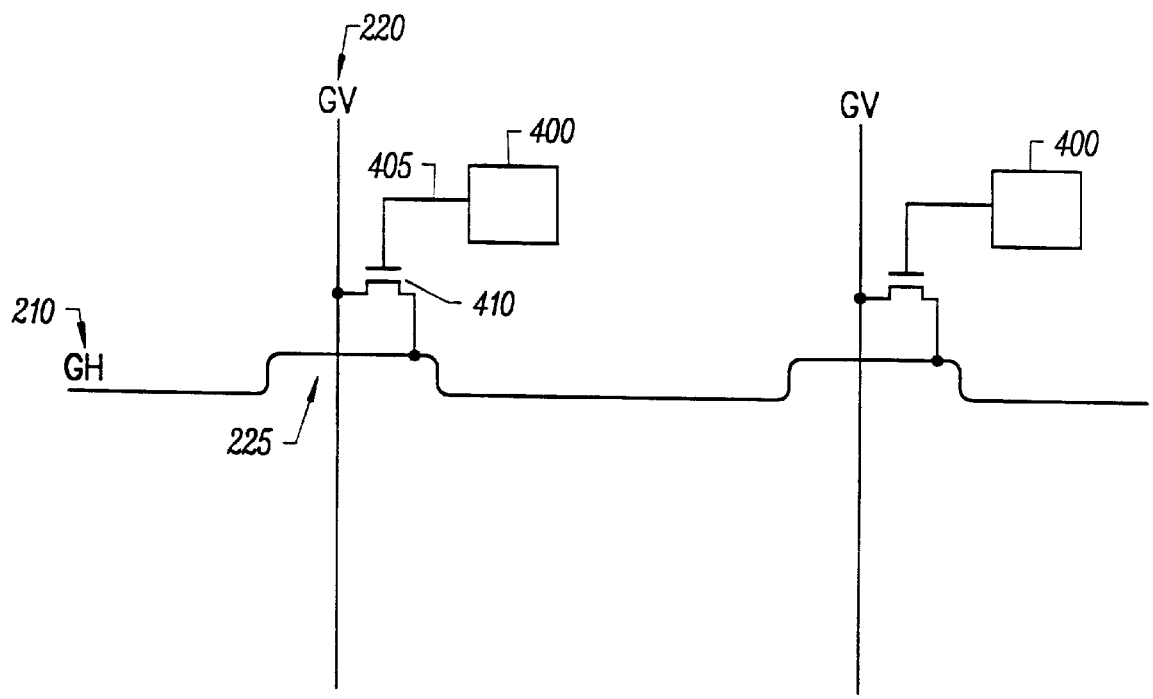
FIG. 4 is a diagram of the memory cell of the present invention used in the programmable interconnect of a programmable logic device.

FIG. 4 is a diagram showing an example of how the present invention may be used in the implementation of the programmable interconnection resources of a PLD, such as shown in FIGS. 2A–D. Memory cell 400 is a programmable memory cell of the present invention. Memory cell 400 stores a logic state, either a high or low logic state. Typically, a logic high state is represented by a "one" or VDD, while a logic low state is represented by a "zero" or ground.

Memory cell 400 is reprogrammable, which means that the cell may be programmed many times with new data. Furthermore, in the present invention, memory cell 400 is nonvolatile, which means that the stored information is retained even when power is removed. For example, after memory cell 400 is programmed with a particular logic state, memory cell 400 stores this information indefinitely until the cell is reprogrammed.

Memory cell 400 has an output node 405 for outputting its stored state. Output node 405 provides either a logic low output or a logic high output, representative of the stated stored in memory cell 400. The output voltage levels at output node 405 are typically full-rail voltages, equal to either about VDD (sometimes referred to as VCC) or VSS of the integrated circuit.

Memory cell 400 may be used to implement many types of logic elements and components. For example, memory cell 400 may be used to implement a flip-flop, register, storage bit, architecture bit, lookup table, programmable interconnect array, RAM, SRAM, ROM, EPROM, EEPROM, content-addressable memory (CAM), PLD, FPGA, PC Card memory card, and other similar memory elements and devices. As shown in FIG. 4, memory cell 400 may be used to implement the programmable interconnection resources of a PLD.

In FIG. 4, GH 210 and GV 220 conductors cross at intersections 225. Intersections 225 are sometimes referred to as crosspoints. As is typically the case with global programmable interconnect, GH 210 and GV 220 lines do not connect at intersections 225 unless they are programmably coupled. A pass transistor 410 and programmable memory cell 400 facilitate the programmable coupling of GH 210 to GV 220, and vice versa. In particular, depending on the data stored in memory cell 400, GH 210 and GV 220 conductors are programmably connected or programmably disconnected at intersection 225.

At intersection 225, pass transistor 410 is coupled between GH 210 and GV 220. A gate of pass transistor 410 is coupled to output node 405 of memory cell 400. Controlled by way of memory cell 400, pass transistor 410 programmably couples GH 210 to GV 220. For example, GV 220 and GH 210 may be coupled together by storing a logic high in memory cell 400. Memory cell 400 would output a high level at output node 405, which is passed to the gate of pass transistor 410. A high at the gate of pass transistor 410 turns pass transistor 410 on, so that GV 220 is electrically coupled to GH 210. In the alternative, GV 220 and GH 210 may be decoupled from another by programming a zero into memory cell 400. In this manner, memory cell 400 of the present invention may be used to implement a global programmable interconnect structure for a PLD.

Furthermore, as discussed earlier, the present invention may provide full-rail voltages at the gate of pass transistor 410. In this case, pass transistor 410 will be either substantially on or substantially off. This allows GHs 210 and GVs 220 to conduct signals throughout the integrated circuit with generally good performance characteristics. For example, when pass transistor 410 is fully on (e.g., the gate is at VDD), the amount of resistance of pass transistor 410 is kept at a minimum, thus improving transient performance. Also, VDD at the gate of pass transistor 410 allows a voltage of about VDD−VT (a threshold voltage of pass transistor 410, including body effect) from one GH 210 or GV 220 conductor to another. Also, when pass transistor 410 is fully off (e.g., the gate is at VSS), no signals will pass (or "leak") from GH 210 or GV 220 conductor to another. Further, when pass transistor 410 is fully off, the GV 220 conductors intersecting a particular GH 210 conductor will not capacitively load that particular GH 210 conductor. These features improve the performance of the programmable logic device integrated circuit.

Pass transistor 410 may be fabricated using many different process technologies, including CMOS, NMOS, PMOS, and bipolar. In a preferred embodiment, pass transistor 410 is an NMOS transistor.

Figure 5A:
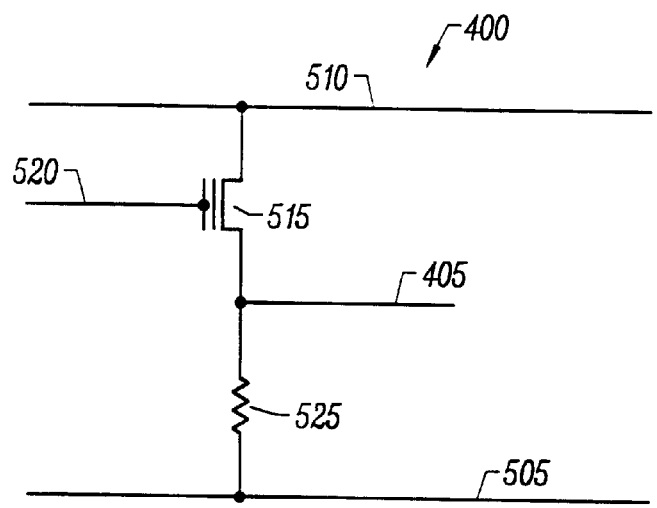
FIG. 5A is a block diagram of a memory cell of the present invention.

FIG. 5A shows a more detailed block diagram of memory cell 400 of the present invention. Memory cell 400 stores a logic state. Memory cell outputs this stored logic state, a logic high or a logic low, onto output node 405. For an integrated circuit, the logic low may be represented by a first voltage level, and the logic high may be represented by a second voltage level. The first voltage level is about VSS. The second voltage level is generally about the supply voltage for the integrated circuit, VDD (or VCC). VDD is typically 5 volts and VSS is ground. Furthermore, to facilitate highly integrated semiconductor circuits, the typical voltage supply of 5 volts has been reduced to a voltage level lest than 5 volts, commonly from about 3.3 volts to 3.6 volts. In the future, supply voltages will be reduced even further to, for example, 2.5 volts or lower.

Furthermore in an embodiment, the supply voltages for memory cell 400 may not the same as the supply voltages for the integrated circuit. In this case, the first voltage level may not be about VSS. The second voltage level may not be about VDD. For example, VDD may be about 5 volts, but this voltage may be reduced to about 3.3 volts for coupling to the internal circuits. In this case, the second voltage level may be a "local" VDD, a VDD which is coupled to memory cell 400 and possibly other internal circuitry. In a further example, the supply voltage of the integrated circuit may be VDD, but the second voltage level for memory cell 400 may be about VDD–VT. In yet another example, VDD may be about 3.3 volts, and the second voltage level for memory cell 500 may be a higher voltage, about 5 volts.

In FIG. 5A, memory cell 40 includes a first voltage source 505, which is typically coupled to VSS, and a second voltage source 510, which is typically coupled to VDD. Further, memory cell 400 includes a programmable memory element 515 coupled between the second voltage source 510 and output node 405. Programmable memory element 515 may be a nonvolatile memory element, which may be fabricated from many different memory technologies. Nonvolatile memory cells retain their stored information even when power is removed. For example, programmable memory element 515 may be fabricated using one-time programmable devices such as fuses or antifuses. Furthermore, programmable memory element 515 may be fabricated using reprogrammable, nonvolatile memory devices such as EPROM, EEPROM, Flash EEPROM, and the like. In a preferred embodiment, programmable memory element 515 is an EEPROM or Flash EEPROM cell.

Further, in memory cell 400, a pull-down device 525 is coupled between a first voltage source 505 and output node 405. Pull-down device 525 may be substantially dissimilar to programmable memory element 515. Pull-down device 525 may be formed using many different types of components, active and passive, including bipolar and MOS transistors, as well as resistors. Pull-down 525 may be programmable or nonprogrammable. In a preferred embodiment, pull-down device 525 is a resistor. On an integrated circuit, a resistor may be fabricated using many different techniques and from different devices. For example, a resistor may formed using polysilicon, undoped polysilicon, polysilicide, n-type diffusion, p-type diffusion, n-well diffusion, and a transistor channel, among others. This resistor may be integrated with other devices or formed from the layout of the memory cell by the interconnect. For example, in a layout, pull-down device 525 may be a serpentine polysilicide interconnect between first voltage source 505 and output node 405.

In one embodiment, pull-down device 525 is a resistor of approximately one gigaohm resistance. However, this resistor may be larger or smaller. For example, pull-down device 525 is a resistor which may be in the range from about three teraohms to about thirty kiloohms. The resistor may be in the range from about thirty kiloohms to about three megaohms. The resistor may be in the range from about three megaohms to about thirty megaohms. The resistor may be from about thirty megaohms to about three hundred megaohms. The resistor may be from about three hundred megaohms to about one gigaohms. The resistor may be from about one gigaohm to about three gigaohms. The resistor may be from about three gigaohms to about ten gigaohms. The resistor may be from about ten gigaohms to about thirty gigaohms. The resistor may be from about thirty gigaohms to about three hundred gigaohms. The resistor may be from about three hundred gigaohms to about three teraohms. The resistor may be greater than three teraohms. As specific examples, a resistor of about fifty megaohms may be used. A resistor of about one hundred megaohms may be used. A resistor of about two hundred megaohms may be used. A resistor of about five hundred megaohms may be used.

The programmable memory element 515 will typically have a resistance on the order of ten kiloohms to one megaohm in the erased state, and a resistance of one to one hundred teraohms in the programmed state. The load resistor should have a resistance intermediate between these two ranges. The precise values of programmed and erased resistance of memory element 515, and hence the optimum load resistance value, will be somewhat technology dependent.

There are currently two preferred methods of manufacture for load resistors to achieve high resistance as used in the present invention. The first is to use undoped, lightly ion-implanted polycrystalline silicon as the load resistor. Resistance values for such resistors can be controlled over a very broad range of from less than one hundred kiloohms to more than one teraohm. This technique has the advantage of relatively simple processing. This approach is practical as long as the total number of memory cells is less than several million. For memory cell counts in the range of ten million or more, standby current requirements may dictate a need for higher load resistance. With current technology, a commonly used approach is to use a p-channel thin-film transistor (TFT) as the load element in this case.

Figure 5B:
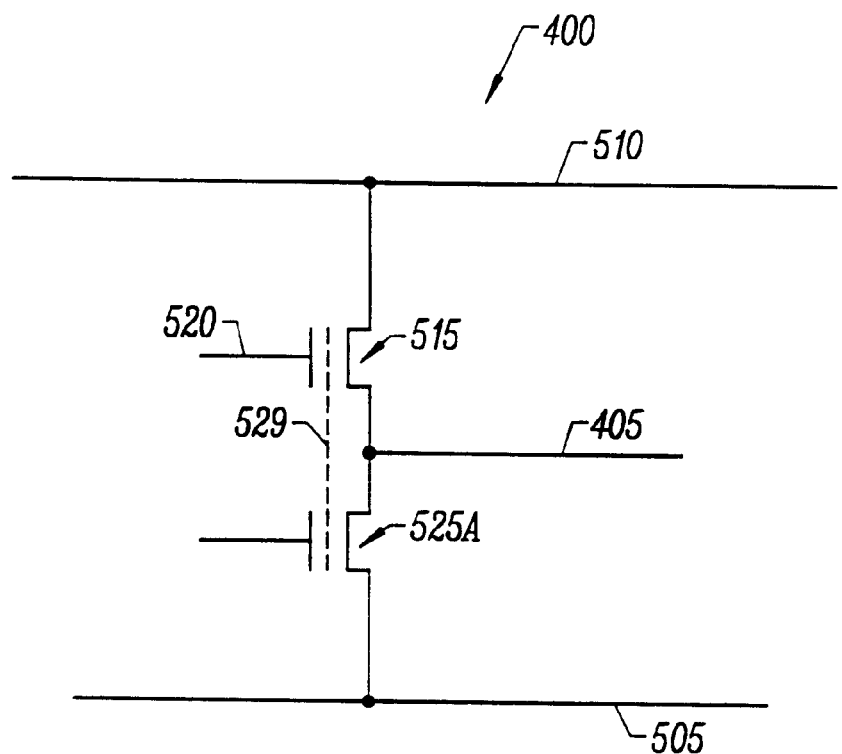
FIG. 5B is a block diagram of a memory cell of the present invention incorporating a thin film transistor.

FIG. 5B shows an example of an embodiment of the present invention using a TFT 525. Such a device is switched between an off state with resistance on the order of fifty teraohms and an on state with resistance on the order of a few hundred megaohms. By coupling a gate of such a device to a gate of the programmable memory element 515, for example, by having them share the same floating gate 529 (as shown in FIG. 5B), the TFT can be switched to its on state when memory element 515 is programmed, and to its off state when memory element 515 is erased. In this way, very low standby currents can be achieved while still satisfying the resistance ratio requirements needed to deliver full, or nearly full, VDD and VSS output levels from the cell.

In operation, memory cell 400 stores and outputs a logic low or logic high. Data is stored in memory cell 400 by programming programmable memory element 515. Programmable memory element 515 has two states, programmed or erased (not programmed). Depending on the memory technology used, the terms "programmed" and "erased" may have different meanings. In this specification, the IEEE convention for these terms is used. Specifically, "programmed" refers to placing a memory element into an "off" or nonconducting state, and "erased" refers to placing a memory element into an "on" or conducting state.

Memory cell 400 produces an output representative of the data stored in programmable memory element 515 at output node 405. When programmable memory element 515 is programmed, output node 405 will be decoupled from second voltage source 510. A standby pull-down current, or first pull-down current, to first voltage source 505 through pull-down device 525 will pull output node 405 to about the first voltage level, representing a logic low. Except for leakage currents, the first pull-down current may be about zero microamps. In this state, memory cell 400 consumes no static power.

When programmable memory element 515 is erased, output node 405 is coupled through programmable memory element 515 to second voltage source 510. A pull-down current, or second pull-down current, to first voltage source 505 through pull-down device 525 will be drained through programmable memory element 515 from second voltage source 510, or VDD. Output node 405 will be at about the second voltage level, a logic high. The magnitude of the pull-down current depends on the size of the resistor and the levels of the first voltage source 505 and second voltage source 510; this current may be calculated by Kirchhoff's laws. For example, pull-down device 525 may be about three gigaohms, and the pull-down current may be less than about one nanoamp.

The pull-down current of the memory cell 400 may be from about one picoamp to about one hundred microamps. The pull-down current may be from about one hundred microamps to about one microamp. The pull-down current may be from about one microamp to about one hundred nanoamps. The pull-down current may be from about one hundred nanoamps to about ten nanoamps. The pull-down current may be from about ten nanoamps to about three nanoamps. The pull-down current may be from about three nanoamps to about one nanoamps. The pull-down current may be from about one nanoamp to about three hundred picoamps. The pull-down current may be from about three hundred picoamps to about one hundred picoamps. The pull down current may be from about one hundred picoamps to about ten picoamps. The pull-down current may be from about ten picoamps to about one picoamp. The pull-down current may be less than about one picoamp. As specific examples, the pull-down current may be about two microamps. The pull-down current may be a less than about half a nanoamp, or even less.

This pull-down current will be the current consumption of memory cell 400. Since memory cell 400 consumes a relatively small amount of current, large arrays of memory cells 400 may be constructed, and the combined power consumption of the entire array of memory cells remains reasonable. For example, if a memory cell consumes a maximum of about one nanoamp, one million memory cells will consume at most about one milliamp. The exact power consumption will depend on whether the memory cells are programmed or erased. Therefore, in a programmable logic device, the power consumption of an array of memory cells 400 of the present invention will be pattern dependent.

Memory cell 400 of the present invention may provide approximately full-rail voltage output at output node 405. More specifically, when programmable memory element 515 is programmed, output node 405 will be at approximately the first voltage level since the off resistance of the programmable memory element 515 will be significantly more than the resistance of pull-down device 525. When programmable memory element 515 is erased, output node 405 will be at approximately the second voltage level since the on resistance of the programmable memory element 515 will be significantly less than the resistance of pull-down device 525.

Memory cell 400 of the present invention may also include features to allow the programming and erasure of programmable memory element 515. More specifically, EPROM, EEPROM, Flash EEPROM cells have floating gates to provide for nonvolatility and reprogrammability. To program and erase these cells, high voltages may be used to transfer charge to and remove charge from the floating gates through the silicon oxide by various physical mechanisms such as avalanche injection, channel injection, quantum-mechanical tunneling, hot electrons, and other phenomena.

A high voltage (VPP) used to program the memory cells may be somewhat different from a high voltage (VEE) used to erase the memory cells. The magnitude of VPP and VEE depends on the physical characteristics of the memory cell including such considerations as the thickness and composition of the dielectric between the substrate and the floating gate. Typically, VPP and VEE voltages are in the range of approximately 11 volts to 15 volts. However, as process technology continues to improve, it will become possible to fabricate thinner and better dielectrics. Consequently, the high voltages needed to program and erase the memory cells may decrease in magnitude.

For EEPROM and Flash EEPROM memory cells, to erase the cells, charge is electrically removed from the floating gate using high voltages and quantum-mechanical tunneling. For EPROM memory cells, charge is removed from the floating gates by exposing the cells to radiation, such as ultraviolet light; exposing EPROM memory cells to ultraviolet light allows the charge in the floating gate to escape. After erasure, EPROM, EEPROM, and Flash EEPROM memory cells may be reprogrammed. EPROM and Flash EEPROM memory cells are generally programmed using hot electrons, while EEPROM cells are programmed using quantum-mechanical tunneling. In some cases, Flash EEPROM memory cells are programmed using quantum-mechanical tunneling. EPROM, EEPROM, and Flash memory cells may be programmed, erased, and reprogrammed many times.

When EPROM, EEPROM, and Flash EEPROM memory cells are programmed, negative charge (e.g., electrons) is placed on the floating gate and a memory cell is placed in a high voltage threshold (VT) state (VTP). In the programmed or high VT state, a reasonable voltage on a gate of the memory cell will not turn the memory cell on. In an embodiment, a reasonable voltage is a voltage between the supplies of the integrated circuit, VDD and VSS. Voltages in this range are readily available, and may be generated without relatively complex circuitry. However, voltages higher than VDD may also be used as the reasonable voltages. Voltages above VDD may be generated, for example, by using charge pumps. Furthermore, in the case when a voltage above second voltage source 510 is placed on the gate, the memory cell may turn on. For example, for EPROM, EEPROM, and Flash EEPROM memory cells, the typical threshold voltage for a memory cell in a high VT state is approximately 5 volts. However, the high VT state may also be above 5 volts. For example, for EPROM memory cells, the high VT state may be about 7 volts. When programmed using an "assist" technique (described below), the high VT state for EEPROM memory cells may be somewhat higher than 5 volts.

In contrast, when erased, negative charge is removed from the floating gate and the memory cell is placed in a low VT state (VTE). In the erased or low VT state, a reasonable voltage on a gate of the memory cell will turn the memory cell on. For EEPROM and Flash EEPROM memory cells, the typical threshold voltage for a memory cell in a low VT state ranges from approximately −2 volts to −4 volts. For EPROM memory cells, the typical threshold voltage in a low VT state is zero volts or slightly above zero volts.

When EEPROM or Flash EEPROM cells are erased using a "smart" algorithm, a specific low VT voltage level state may be achieved. For example, the VTE may be about −1 volts. In another example, the VTE may be zero volts or slightly above zero volts. A smart algorithm removes charges from the floating gate using an iterative technique, removing small amounts of charge until a desired VTE is achieved. A smart algorithm may be used to prevent a negative VTE, especially important in some applications where a negative VTE is undesirable such as for high-density, high-capacity Flash EEPROM memories. In other applications such as programmable logic devices, a negative low VT state may be allowable because, among other reasons, the memory cell may be accessed using a read transistor in series with the memory cell. The present invention does not require the use of a smart algorithm since memory cell 400 operates and functions properly when programmable memory element 515 has a negative VTE.

Also, when an array of EPROM or Flash EEPROM memory cells is initialized, the cells are erased to a low VT state. For example, an EPROM array is initialized when exposed to ultraviolet light. Flash EEPROM memory cells are initialized when bulk erased. However, when an array of EEPROM memory cells is initialized, the cells typically may be programmed to a high VT state. The initiation state of a memory array is chosen based on many considerations including the fabrication of the memory cell devices themselves and the intended use for the memory cells.

A control gate 520 activates programmable memory element 515. During normal operation, control gate 520 is coupled to a voltage level which activates and enables operation of programmable memory element 515. Until activated, programmable memory element 515 may decouple second voltage source 510 from output node 405 during normal operation. To activate programmable memory element 515, control gate 520 is coupled to a third voltage level which is greater than VTE and less than the VTP. For example, for a typical EEPROM cell, control gate 520 should above about −2 volts (VTE) and less than about 5 volts (VTP). In a preferred embodiment of the present invention, in which the programmable memory element 515 is the pull-up device to the VDD power supply, the third voltage level is chosen to provide the greatest amount of programming and erase margin for extreme cases of operation. For the programmed state, one extreme case is the typical one of zero source bias. For the erased state, however, the extreme case is with source bias equal to VDD. In this case, the programmable memory element 515 should remain conducting. For example, if VTE is about −4 volts (without source bias) and VTP is about 5 volts, and if VDD is 3.3 volts, the control gate may be set at about VDD to provide about 1.5 volts or more of margin for the two extreme cases discussed. As a further example, for an EPROM memory cell, where VTE equals about zero volts and VTP equals about 7 volts, control gate 520 may be tied to a higher voltage level than VDD. An activation voltage above VDD may be used because for example, this may be required by the memory element, or a higher voltage level is readily available. Control gate 520 is also used during the programming of programmable memory cell 515, which is described in more detail below.

Figure 5C:
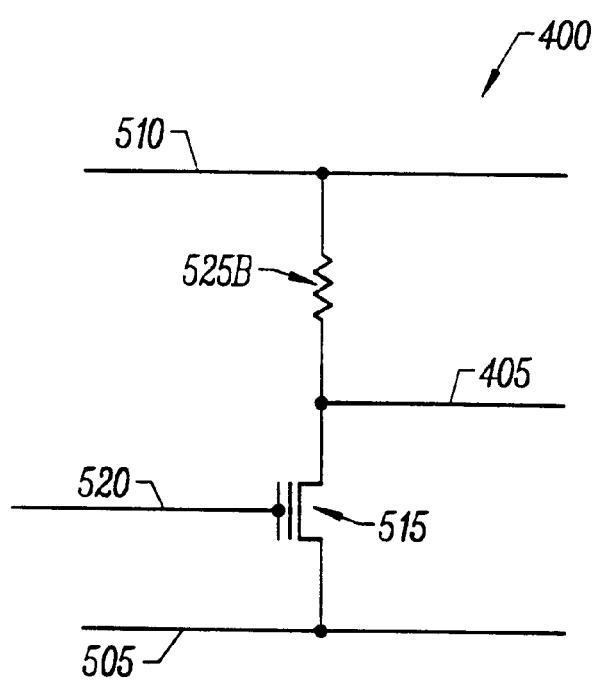
FIG. 5C is a block diagram of an alternative embodiment of the memory cell of the present invention.

FIG. 5C shows an embodiment of the present invention where programmable memory element 515 is coupled between output node 405 and first voltage source 505. A pull-up device 525B is coupled between output node 405 and second voltage source 510. The embodiment shown in this figure operates in analogous fashion to that described for FIG. 5A. Programmable memory element 515 would be used to couple output node 405 to a logic low level. Pull-up device 525B would be used to couple output node 405 to a logic high level.

The embodiment in FIG. 5A has some advantages compared to the cell in FIG. 5C. In particular, during the operation of an electronic circuit, switching noise may be coupled into node 405 from the operation of circuitry coupled to node 405. This noise tends to be of a higher magnitude when output node 405 is at a logic high, rather than at a logic low. For example, as shown in FIG. 4, node 405 may be coupled to a pass transistor 410, which is between GH and GV conductors. When pass transistor 410 is in the on state, switching noise from signals on the GH and GV conductors is coupled to node 405. The voltages coupled to node 405 from switching noise may be in the positive or negative direction. As an example, node 405 may be boosted to a higher voltage during low-to-high transitions on the GH and GV conductors. It is undesirable to propagate this noise to other elements in the circuit since this may be a source of logical errors. These boosted voltages may also damage to decrease the longevity of the memory cell.

Under the above conditions, the memory cell of FIG. 5A will tend to hold node 405 to a more stable voltage than the embodiment in FIG. 5C. This is because any voltage coupled into node 405, when it is a logic high, can be discharged (relatively quickly) through the relatively low impedance of memory element 515 for FIG. 5A. Compared to the configuration of FIG. 5C, boosted voltages at node 405 may not be discharged as easily because of the relatively large impedance of resistor 525B.

On the other hand, for the embodiment of FIG. 5C, when programmable memory element 515 is in the erased state, there is a reduced electric field between the channel and the substrate of programmable memory element 515. Specifically, when a floating gate memory cell (such as EEPROM or Flash EEPROM) is used, the floating gate is not subjected to a channel-to-substrate bias (referred to as floating gate disturb phenomena). The channel of programmable memory element 515 in the embodiment of FIG. 5C is at zero volts or cutoff. A channel-to-substrate bias generates electron-hole pairs. These electrons may be attracted to the floating gate, which may disturb the memory cell and reduce the lifetime of the device. Therefore, with respect to this phenomenon, the embodiment of FIG. 5C of the present invention would have excellent data retention and reliability characteristics, even when VDD is 5 volts. In practice, the choice between the embodiment of FIG. 5A versus FIG. 5C may be made based on careful consideration of the specific technology available and the circuit noise environment.

Figure 6:
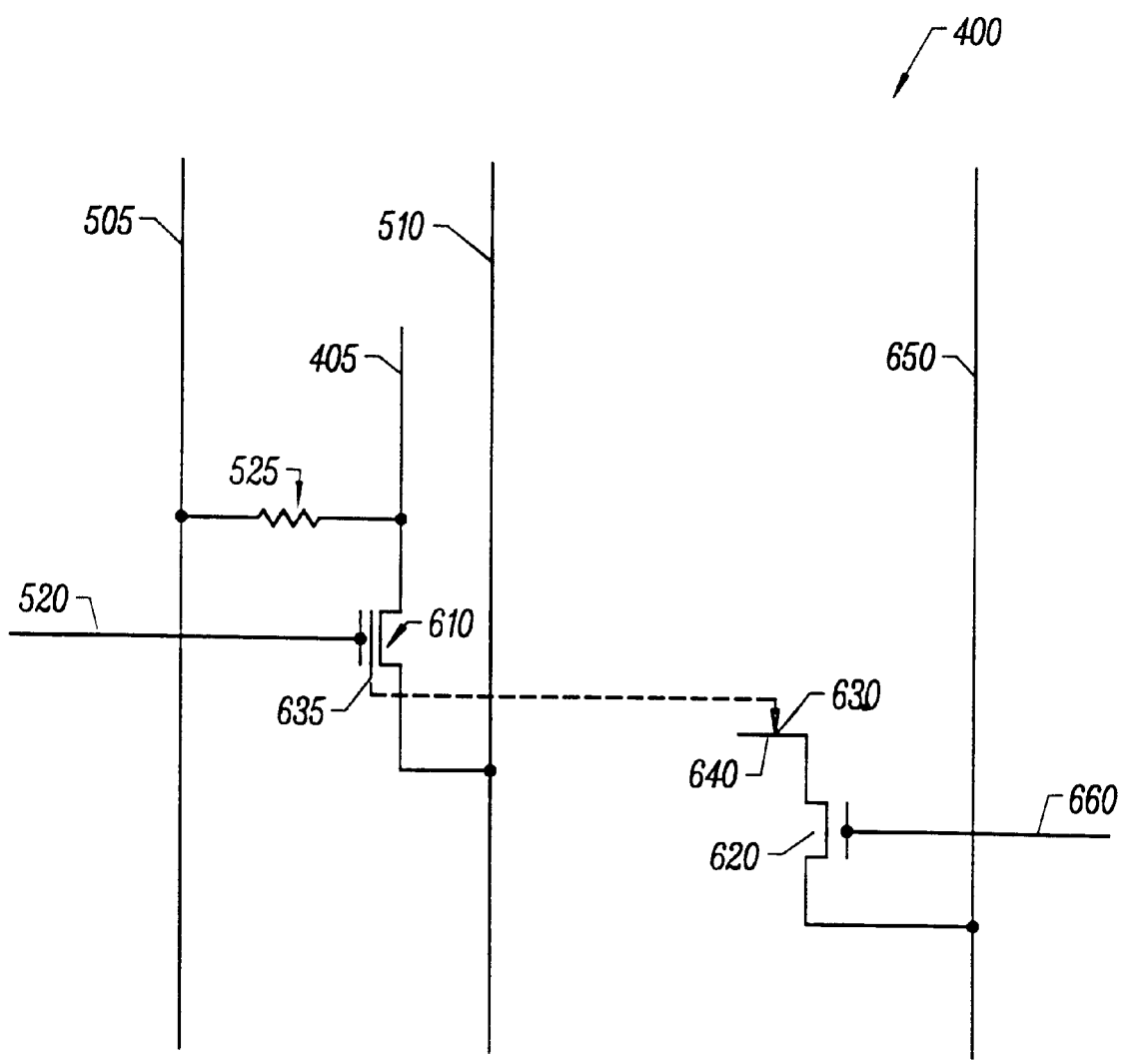
FIG. 6 shows a memory cell of the present invention implemented using EEPROM cells.

FIG. 6 shows a diagram of a specific embodiment of a memory cell 400 of the present invention. In this embodiment, memory cell 400 is implemented using an EEPROM memory cell 600. An array of memory cells 400 may be constructed by mirroring and repeating the memory cell in horizontal and vertical directions. In FIG. 6, the programmable memory element is implemented using a single- or double-polysilicon EEPROM cell 610. Further, memory cell 400 of FIG. 6 includes additional transistors and signal lines to provide for the programming of EEPROM cell 610.

Memory cell 400 includes the following devices: EEPROM cell 610, pull-down device 525, and a select transistor 620. Furthermore, memory cell 40 has a tunnel dielectric 630 for transferring electrons from a tunnel diode 640 to a floating gate 635 of EEPROM cell 610. EEPROM cell 610 is coupled between second voltage source 510 and output node 405. EEPROM cell 610 has a control gate 520. Pull-down device 525 is coupled between first voltage source 505 and output node 405. In a preferred embodiment, pull-down device 525 is a resistor, as discussed previously. Select transistor 620 is coupled between tunnel diode 640 and an erase node 650. Select transistor has a select gate 660.

Memory cell 400 of FIG. 6 operates substantially similarly to memory cell 400 of FIG. 5A. EEPROM cell 610 is configured to store the data of memory cell 400. Data stored in memory cell 400 is output at output node 405. When initialized, an array of EEPROM cells is typically bulk programmed to a high VT state. A typical VTP for an EEPROM cell is about 5 volts to 6 volts. In a high VT state, an EEPROM cell decouples its drain terminal from its source terminal. When erased to a low VT state, an EEPROM cell couples its drain terminal to its source terminal. A typical VTE for EEPROM cells is about −3 volts.

By appropriately configuring EEPROM cell 610, memory cell 400 will store a logic high or logic low. To store a logic low, EEPROM cell 610 remains programmed. Then, output node 405 will be pulled to a logic low, at the first voltage level, by a first pull-down current to first voltage source 505 through pull-down device 525. To store a logic high, EEPROM cell 610 is erased. A pull-down current to first voltage source 505 through pull-down device 525 will be drained through EEPROM cell 610 from second source 510. Output node 405 will approximately equal the second voltage level or VDD, a logic high.

Control gate 520 activates the EEPROM cell 610. As discussed, during normal operation, control gate 520 is set at a voltage between the VTE and VTP of EEPROM cell 610 to maximize the amount of programming and erase margin. In one embodiment, this voltage is approximately VDD (e.g., 3.3 volts).

Control gate 520 is also used during the programming of EEPROM cell 610. To initialize (or program) EEPROM cell 610, control gate 520 is set to VPP. Erase node 650 is grounded. Select gate 660 is set at a voltage to turn on select transistor 620. Select gate 660 is typically set to a voltage of about 2 volts, although any voltage in the range from 2 volts to VPP will also turn on select transistor 620. Second voltage source 610 and first voltage source 505 are grounded. Under these conditions, electrons will tunnel from tunnel diode 640 through tunnel dielectric 630 into floating gate 635 of EEPROM cell 610. Floating gate 635 becomes negatively charged so that EEPROM cell 610 is programmed to the high VT state. This may be done globally to program all bits in an array of EEPROM cells 610.

By using an assist programming technique, VTP may be boosted to a higher value. For assist programming, second voltage source 510 is set to an assist voltage of about VDD. First voltage source 505 is allowed to float (or set at VDD). Since control gate 520 is at VPP, output node 405 is also at about VDD. First voltage source 505 will float to about VDD through pull-down device 525. Under these conditions, there is additional voltage coupling to floating gate 635 through the channel of EEPROM cell 610 that boosts the initial voltage of the floating gate. When the initial voltage of the floating gate is higher, the resulting VTP voltage will be higher. Consequently, more electrons become trapped in floating gate 635 than under the programming conditions without assist. Hence, floating gate 635 is programmed to a higher VTP level. Furthermore, the assist voltage may be above VDD to increase the voltage coupling to floating gate 635. For example, the assist voltage may be about VPP.

EEPROM cells are typically programmed using quantum-mechanical tunneling. By using quantum-mechanical tunneling, substantially less current is needed to program EEPROM cells than for example, Flash EEPROM cells, which are typically programmed using hot electrons. EEPROM cells are programmed primarily due to the magnitude of the high voltages across very thin dielectrics (typically seventy-five angstroms to ninety angstroms of oxide). Therefore, since high currents are not necessary, the use of EEPROM cells generally provides integrated circuits which may be configured while resident on a system board—sometimes referred to as in-system programming (ISP)—where large currents are often unavailable.

Quantum-mechanical tunneling is also the mechanism used to erase EEPROM cell 610. EEPROM cells are selectively erased. For example, to erase EEPROM cell 610, select gate 660 is set to VEE+VT (a threshold voltage of select transistor 620). Erase node 650 is coupled to VEE. Control gate 620, first voltage source 505, and second voltage source 510 are grounded. VEE is passed through select transistor 620 to tunnel diode 640. Electrons from floating gate 635 of EEPROM cell 610 are attached through tunnel dielectric 630 into tunnel diode 640. This removes electrons from the floating gate 635 of EEPROM cell 610. Thus, EEPROM 610 is erased to a low VT state. For an array of EEPROM cells 610, this operation is repeated in a row-by-row or column-by-column basis until the desired pattern is imprinted into the array.

When erasing EEPROM cells 610, a negative assist programming technique may be used by placing a negative assist voltage on control gate 520. For example, a voltage of −3 volts may be placed on control gate 520. This would decrease VTE, improving the erase margin of EEPROM cell 610.

An array of EEPROM cells may be monitored to verify the program and erase states of the bits. Several methods for this are possible. In one method, to verify the program margin, the erase nodes 650 of the array are grounded. Second voltage sources 510 are set to about 2 volts. The voltage at a control gate 520, corresponding to the row of cells being verified, is swept under an EEPROM cell 610 begins conducting and the corresponding first voltage source 505 line begins conducting. This procedure allows the verification of one row of EEPROM cells 610 at a time. All of the bits in that row are verified through separate first voltage source 505 lines.

Figure 7:
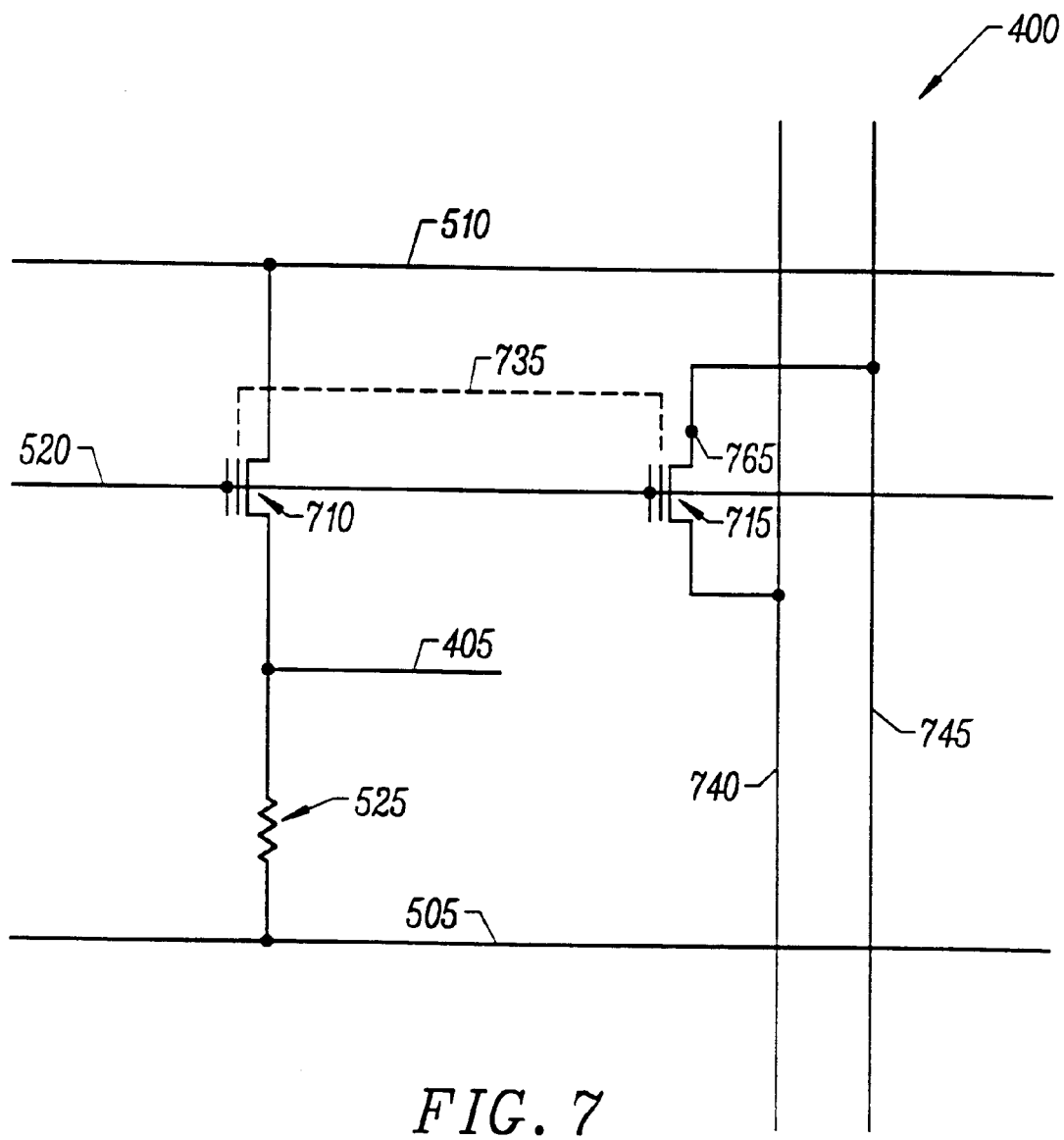
FIG. 7 shows a memory cell of the present invention implemented using two-transistor double-polysilicon Flash EEPROM memory cells.

FIG. 7 shows memory cell 400 of the present invention implemented using two-transistor double-polysilicon Flash EEPROM memory cells. This cell may be repeated to form an array of memory cells. In this embodiment, memory cell 400 includes a Flash EEPROM read cell 710 and a Flash EEPROM program cell 715. Flash EEPROM read cell 710 shares a floating gate 735 with Flash EEPROM program cell 715. Flash EEPROM read cell 710 and Flash EEPROM program cell 715 are configured to store data in memory cell 400.

Flash EEPROM read cell 710 is coupled between second voltage source 510 and output node 405. Flash EEPROM program cell 715 is coupled between program node 740 and erase node 745. A pull-down device 525 is coupled between first voltage source 505 and output node 405. Data stored in memory cell 400 is read or output from output node 405. Depending on the programmed state of Flash EEPROM read cell 710, output node 405 will provide a logic high or logic low output. Flash EEPROM program cell 715 facilitates the configuration of EEPROM read cell 710.

A control gate 520 is coupled to a gate of Flash EEPROM read cell 710 and a gate of Flash EEPROM program cell 715. A control gate 520 is analogous to control gate 520 of FIG. 5A. Control gate 520 may be used to activate Flash EEPROM read cell 710. For normal operation of memory cell 400, control gate 520 is set at a voltage so that approximately full-rail voltage output is provided at output node 405. More specifically, during normal operation, control gate 520 is set at a voltage between the VTE and VTP of Flash EEPROM read cell 710 to maximize the amount of programming and erase margin. In one embodiment, this voltage is approximately VDD (e.g., 3.3 volts).

By appropriately configuring Flash EEPROM read cell 710 in either a programmed or erased state, memory cell 400 may store a logic low in a first state and a logic high in a second state. Flash EEPROM memory cells are initialized to a low VT state. To store a logic high, Flash EEPROM read cell 710 remains erased in a low VT state. A pull-down current (second pull-down current) through pull-down device 525 will be drained through Flash EEPROM read cell 710 from second voltage source 510. Output node 405 will be at a voltage approximately equal to second voltage source 510, representing a logic high. To store a logic low, Flash EEPROM read cell 710 is programmed to a high VT state. A standby pull-down current (first pull-down current) to first voltage source 505 through pull-down device 525 pulls output node 405 to a logic low. Then, output node 405 will approximately equal the level of the first voltage source 505, which represents a logic low.

Flash EEPROM program transistor 715 is used to program and erase Flash EEPROM read cell 710. To initialize (erase) Flash EEPROM cells 710 and 715 to a low VT state, VEE is placed at erase node 745. Control gate 520 is held at a low voltage, grounded or negative. First voltage source 505, second voltage source 510, and program node 740 are grounded. VEE is coupled to a tunnel dielectric (TD) source 765, which is coupled to Flash EEPROM program cell 715. TD source 765 is a diffusion region of memory cell 400. For example, TD source 765 may be comprised of n+ diffusion. TD source 765 may also be separate diffusion regions coupled together via a conductor. Typically, one or more tunnel dielectrics are positioned above TD source 765. From TD source 765, via the appropriate tunnel dielectric, electrons may pass to and from the floating ate of Flash EEPROM program cell 715, and consequently through the shared floating gate to the floating gate of Flash EEPROM read cell 710. A high voltage VEE at TD source 765 attracts electrons out of the floating gates of Flash EEPROM cells 710 and 715. Flash EEPROM cells 710 and 715 are erased using quantum-mechanical tunneling. This places Flash EEPROM cells 710 and 715 in a low VT state. The VTE of Flash EEPROM cells 710 and 715 is approximately −3 volts. The time to erase Flash EEPROM cells 710 and 715 is typically about one hundred milliseconds. However, the erase of time may be less than one hundred milliseconds, and may also be very much greater than one hundred milliseconds.

To program memory cell 400 to a logic low, Flash EEPROM cells 710 and 715 are programmed to a high VT state. To program Flash EEPROM cells 710 and 715, VPP is placed on control gate 520. A VPD voltage is placed on program node 740. VPD is selected to optimize the efficient programming of Flash EEPROM program cell 715. These considerations include ensuring that the Flash EEPROM cells 710 and 715 are programmed well, minimizing any destructive effects on the cell, and observing the current density constraints of the power conductors. In one embodiment, VPD is about 6 volts. Erase mode 745, first voltage source 505, and second voltage source 510 are grounded.

Under these conditions, a significant current flows from program node 740 through Flash EEPROM program cell 715 to erase node 745. For example, this current may be about five hundred microamps. This current is typically in the range from about one hundred microamps to one milliamp. This current generates hot electrons, some of which jump a dielectric barrier and become trapped in the shared floating gate of Flash EEPROM cells 710 and 715. This floating gate becomes negatively charged. Flash EEPROM cells 710 and 715 are programmed to a high VT state, via shared floating gate 735. VTP is typically about 5 volts to 6 volts.

Furthermore, VTP may be boosted to a higher value by using an "assist" programming technique. In assist programming, when programming Flash EEPROM cells 710 and 715, second voltage source 510 is set at about VDD or higher. Since control gate 520 is VPP, output node 405 is also at about VDD or higher. Under these conditions, more electrons become trapped in the floating gate than under the programming conditions described above. Hence, the floating gate is programmed to a higher VTP.

The shared floating gate configuration, as shown in FIG. 7, has several advantages related to layout and processing considerations. The layout of the memory cell 400 of FIG. 7 minimizes the sizes of the topography steps due to the semiconductor processing, so that the metal lines and other conductors which run across an array of memory cells 400 will not become too thin. More specifically, as the steps of an integrated circuit become steeper, the metal lines that traverse over and cover these steps become thinner at the corners of the steps. If the metal lines become too thin, this may lead to breaks or fractures in the lines. The layout of the shared floating gate configuration shown in FIG. 7 tends to have a flatter topography, which minimizes the step sizes. This feature of the present invention helps prevent the problems of breaks and fractures in the metal lines as well as other process layers.

The present invention shares floating gate 735 between Flash EEPROM read cell 710 and Flash EEPROM program cell 715. Sharing floating gate 735 enables the optimization of the programming and read characteristics of the Flash EEPROM program and read cell to achieve longer device lifespans, improve data retention, and increase performance. A reason for this is that Flash EEPROM read cell 710 and Flash EEPROM program cell 715 can, for example, be doped, controlled, and processed somewhat independently from each other. For example, Flash EEPROM program cell 715 can be optimized to improve the ease of programming floating gate 735; and, Flash EEPROM read cell 710 may be optimized to improve the programming margin and charge retention characteristics of the floating gate during normal operation, thereby increasing memory cell longevity.

In other embodiments of the present invention, another TD source may be coupled to Flash EEPROM read cell 710, similarly to Flash EEPROM program cell 715. This additional TD source and associated tunnel dielectrics will facilitate the convenient and efficient transfer of electrons to and from the shared floating gate 735. However, when only one TD source 765 is used, as shown in FIG. 7, memory cell 400 can still be programmed efficiently, and the processing and fabrication of memory cell 400 is somewhat simplified. Overall, the embodiment of the present invention shown in FIG. 7 produces memory cells 400 with higher read current, better programming characteristics, and enhanced device longevity compared to Flash EEPROM cells with only one floating gate transistor.

Programming and erase for an array of memory cells is generally analogous to the techniques described above. Further, when programming an array of memory cells, there are many techniques for ensuring only the desired EEPROM cells are programmed, while others are left undisturbed. For example, if the EEPROM cells have a depletion VT, the cells not selected for programming may be deselected by using a negative control gate voltage. A further technique for deselecting particular EEPROM cells may involve back biasing the wells of the unselected cells.

Figure 8:
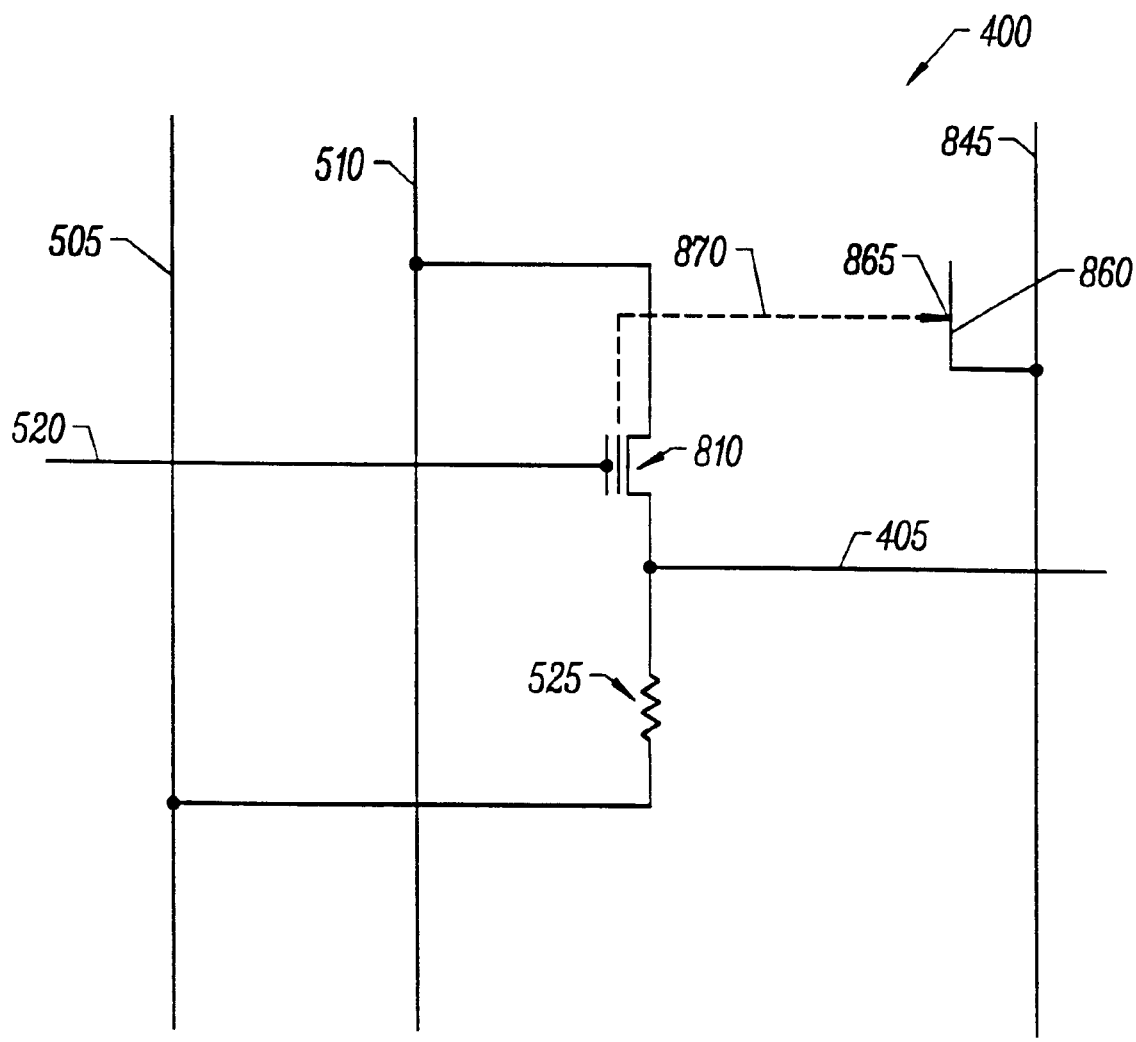
FIG. 8 shows another embodiment of a memory cell of the present invention implemented using Flash EEPROM memory cells.

FIG. 8 shows memory cell 400 of the present invention implemented using "one-and-a-half"-transistor single- or double-polysilicon Flash EEPROM memory cells. This cell may be repeated to form an array of memory cells. The electrical characteristics of the Flash EEPROM memory cells in this configuration are similar to those discussed above. This embodiment of memory cell 400 is very compact and includes the following devices: a Flash EEPROM cell 810, a tunnel diode 860, and a tunnel dielectric 865. Flash EEPROM cell 810 has a floating gate 870.

Flash EEPROM cell 810 is configured to store data in memory cell 400. Flash EEPROM cell 810 is coupled between output node 405 and second voltage source 510. A pull-down device 525 is coupled between first voltage source 505 and output node 405. In this embodiment, pull-down device 525 is a resister. Data stored in memory cell 400 is read or output from output node 405. Depending on the state of Flash EEPROM cell 810, output node 405 will represent a logic high or logic low.

Tunnel diode 860 facilitates the configuration of Flash EEPROM cell 810. Tunnel diode 860 is coupled to erase node 845. Tunnel diode 860 is coupled by tunnel dielectric 865 to floating gate 870 of Flash EEPROM cell 810. Control gate 520 is coupled to a gate of Flash EEPROM cell 810. Control gate 520 is used to activate Flash EEPROM cell 810. For normal operation of memory cell 400, control gate 520 is set at a voltage so that approximately full-rail voltage output is provided at output node 405. More specifically, as described earlier, during normal operation, control gate 520 is set at a voltage between the VTE and VTP of Flash EEPROM cell 810 to maximize the amount of programming and erase margin. In one embodiment, this voltage is approximately VDD (e.g., 3.3 volts).

By appropriately configuring Flash EEPROM cells 810 in either programmed or erased states, memory cell 400 may store a logic low in a first state and a logic high in a second state. Flash EEPROM memory cells are initialized to a high VT state. In the first state, to store a logic low, Flash EEPROM cell 810 remains programmed in a high VT state. A standby pull-down current (first pull-down current) to first voltage source 505 through pull-down device 525 will pull output node 405 to a logic low. Output node 405 will approximately equal the level of the first voltage source 505. In the second state, to store a logic high, Flash EEPROM cell 810 is erased to a low VT state. A pull-down current (second pull-down current) through pull-down device 525 will be drained through Flash EEPROM cell 810 from the second voltage source 510. Then, output node 405 will approximately equal the voltage level of second voltage source 510, which represents a logic high.

In this embodiment, Flash EEPROM cell 810 may be programmed and erased using quantum-mechanical tunneling. This may be referred to as full $E^2$ operation of the memory cell. The following example shows how this configuration of Flash EEPROM cells may be programmed and erased using full $E^2$ operation. In this case, the Flash EEPROM cells are initialized (or bulk programmed) to the high VT state. Control gate 520 is coupled to VPP. First voltage source 505, second voltage source 510, and erase node 845 are grounded. Electrons tunnel from tunnel diode 860, through tunnel dielectric 865, to floating gate 870. As a result, Flash EEPROM cell 810 is programmed to the high VT state. An assist technique may also be used to achieve a high VTP by placing VDD or a higher voltage at first voltage source 505 or second voltage source 510.

In full $E^2$ operation, the Flash EEPROM cells are selectively erased to a low VT state. For example, to erase Flash EEPROM cell 810, control gate 520 is grounded or placed at a negative voltage (for negative assist programming as discussed above). Second voltage source 510 is grounded. First voltage source 505 may be floating or grounded. Erase node 845 is coupled to VEE. Electrons will tunnel from the floating gate of Flash EEPROM cell 810 through tunnel dielectric 865 to tunnel diode 860. Flash EEPROM cell 810 is erased to a low VT state.

In full $E^2$ operation of the memory cell of FIG. 8, the Flash EEPROM cell may also be initialized (i.e., bulk erased) to the low VT state. In this case, control gate 520 will be grounded or placed at a negative voltage. Second voltage source 510 is grounded. Erase node 845 is coupled to VEE. The Flash EEPROM cells are selectively programmed to the high VT state. For example, to program Flash EEPROM cell 810, control gate 520 is coupled to VPP. First voltage source 505, second voltage source 510, and erase node 845 are grounded. Electrons tunnel from tunnel diode 860, through tunnel dielectric 865, to floating gate 870. As a result, Flash EEPROM cell 810 is programmed to the high VT state. An assist technique may also be used to achieve a high VTP by placing VDD or a higher voltage at first voltage source 505 or second voltage source 510.

To avoid programming or erasing unselected neighboring cells, intermediate, or half-select, voltages may be placed on control gate 520 and erase nodes 845 of the neighboring cells. These intermediate voltages are sufficiently low to avoid (or prevent) either reprogramming of previously erased cells or erasing of programmed cells which are intended to remain programmed, or vice versa for the blanket initial programming embodiment.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. A memory cell comprising:
   a tunnel dielectric;
   a first voltage source;
   a second voltage source, above the first voltage source during a normal operation state;
   a floating gate device, coupled between the second voltage source and an output node, wherein a floating gate of the floating gate device is coupled to the tunnel dielectric;

a tunnel diode, coupled to the tunnel dielectric, wherein the tunnel dielectric transfers charge between the floating gate and the tunnel diode;

a select transistor, coupled between an erase node and the tunnel diode; and a pull-down element, coupled between the first voltage source and the output node, wherein the pull-down element provides a first pull-down current to pull the output node to a voltage level representing a logic low when the floating gate device is programmed, and a second pull-down current that is discharged through the floating gate device to provide a voltage level representing a logic high at the output node when the floating gate device is erased.

2. The memory cell of claim 1 wherein the pull-down element is a resistor.

3. The memory cell of claim 1 wherein the pull-down element is a thin-film transistor.

4. The memory cell of claim 1 wherein the pull-down element is a polysilicon resistor.

5. The memory cell of claim 1 wherein the pull-down element has a resistance from about 100 megaohms to about 10 gigaohms.

6. The memory cell of claim 1 wherein the pull-down element has a resistance of about 1 gigaohm.

7. The memory cell of claim 1 wherein the second pull-down current is less than about 2 microamps.

8. A programmable logic integrated circuit comprising a memory cell as recited in claim 1.

9. The memory cell of claim 1 wherein the floating gate device and select transistor are n-channel transistors.

10. The memory cell of claim 1 wherein at the output node, the memory cell provides a logical high at about a level of the second voltage source and a logical low at about a level of the first voltage source.

11. The memory cell of claim 1 wherein the floating gate device is an EEPROM memory cell.

12. The memory cell of claim 1 wherein the floating gate device is a single-polysilicon EEPROM memory cell.

13. The memory cell of claim 1 wherein the memory cell is erased, the floating gate device is a double-polysilicon EEPROM memory cell.

14. The memory cell of claim 1 wherein when the memory cell is erased, the floating gate device is programmed to a high VT state.

15. The memory cell of claim 1 wherein when in a programmed state, the floating gate device has a threshold voltage from about 5 volts to about 6 volts.

16. The memory cell of claim 1 wherein when in an erased state, the floating gate device has a threshold voltage of about −3 volts.

17. The memory cell of claim 1 wherein to store a logic low, using the memory cell, the floating gate device is a programmed state.

18. The memory cell of claim 1 wherein to store a logic high using the memory cell, the floating gate device is in an erased state.

19. The memory cell of claim 1 wherein during the normal operation state of the memory cell, a control gate node of the floating gate device is coupled to a voltage between about a VTE and about a VTP of the floating gate device.

20. The memory cell of claim 1 wherein during the normal operation state of the memory cell, a control gate node of the floating gate device is coupled to a voltage level of the second voltage source.

21. The memory cell of claim 1 wherein during a programming mode of the memory cell, a control gate node of the floating gate device is coupled to a VPP voltage, above a voltage level of the second voltage source.

22. The memory cell of claim 21 wherein during the programming mode, the erase node is grounded.

23. The memory cell of claim 21 wherein during the programming mode, the select transistor is placed in an on state.

24. The memory cell of claim 1 wherein during a programming mode of the memory cell, the select transistor is turned on my placing a voltage level of about 2 volts or greater at a gate of the select transistor.

25. The memory cell of claim 21 wherein during the programming mode, the first and second voltage sources are grounded.

26. The memory cell of claim 21 wherein during the programming mode, the second voltage source is placed at a voltage of about to VDD.

27. The memory cell of claim 26 wherein during the programming mode, the first voltage source is floating.

28. The memory cell of claim 26 wherein during the programming mode, the first voltage source is placed at a voltage of about VDD.

29. The memory cell of claim 1 wherein the floating gate device is programmed using tunneling.

* * * * *

UNITED STATES PATENT AND TRADEMARK OFFICE
CERTIFICATE OF CORRECTION

PATENT NO. : 6,295,230 B1
DATED : September 25, 2001
INVENTOR(S) : Madurawe et al.

It is certified that error appears in the above-identified patent and that said Letters Patent is hereby corrected as shown below:

Column 22,
Line 8, after the word "is" insert -- in --.
Line 30, replace the word "my" with -- by --.
Line 37, delete the word "to".

Signed and Sealed this

Eighteenth Day of February, 2003

JAMES E. ROGAN
*Director of the United States Patent and Trademark Office*